(12) United States Patent
Terstrup et al.

(10) Patent No.: US 10,797,686 B1
(45) Date of Patent: Oct. 6, 2020

(54) PHASE PREDICTOR AND ASSOCIATED METHOD OF USE

(71) Applicant: Microchip Technology Inc., Chandler, AZ (US)

(72) Inventors: Morten Terstrup, Stenlose (DK); Thomas Joergensen, Soeborg (DK)

(73) Assignee: Microchip Technology Inc., Chandler, AZ (US)

( * ) Notice: Subject to any disclaimer, the term of this patent is extended or adjusted under 35 U.S.C. 154(b) by 0 days.

(21) Appl. No.: 16/557,866

(22) Filed: Aug. 30, 2019

Related U.S. Application Data

(60) Provisional application No. 62/833,533, filed on Apr. 12, 2019.

(51) Int. Cl.
*H03K 5/135* (2006.01)
*H04L 7/033* (2006.01)
*H03L 7/085* (2006.01)

(52) U.S. Cl.
CPC ............. *H03K 5/135* (2013.01); *H03L 7/085* (2013.01); *H04L 7/033* (2013.01)

(58) Field of Classification Search
CPC .......... H03K 5/135; H03L 7/085; H04L 7/033
See application file for complete search history.

(56) References Cited

U.S. PATENT DOCUMENTS

| | | | |
|---|---|---|---|
| 6,744,285 B2 * | 6/2004 | Mangum | ................... G06F 1/12 326/96 |
| 7,206,958 B1 | 4/2007 | Sutherland et al. | |
| 2005/0008110 A1 | 1/2005 | Lake et al. | |
| 2018/0138913 A1 | 5/2018 | Grouwstra et al. | |

OTHER PUBLICATIONS

PCT/US2019/052589, International Search Report and Written Opinion of the International Searching Authority, dated Jan. 8, 2020.

* cited by examiner

*Primary Examiner* — Dinh T Le
(74) *Attorney, Agent, or Firm* — Glass and Associates; Kenneth Glass; Molly Sauter

(57) ABSTRACT

A phase predictor to accurately detect and predict the phase relationship between two clocks running at different frequencies. The phase relationship can be used to record the transmission and reception times of Ethernet frames transmitted over a transmission medium with very high accuracy.

20 Claims, 6 Drawing Sheets

PHASE PREDICTOR AND ASSOCIATED METHOD OF USE

CROSS-REFERENCE TO RELATED APPLICATIONS

This application claims priority to currently U.S. Provisional Patent Application No. 62/833,533, filed on Apr. 12, 2012 entitled, "Digital Clock Phase Detector and Associated Method of Use", which is hereby incorporated by reference in its entirety.

BACKGROUND OF THE INVENTION

Phase predictors are known to continuously predict the phase relationship between two different clocks. Knowing the phase relationship between two different clocks has application in digital phase locked loops (PLLs) and Precision Time Protocol (PTP) systems, as well as 5G telecom networks and various equipment measurement systems where it is necessary to know the phase relationship of the clocks to an accuracy that provides for synchronization of the clock signals.

The synchronization accuracy of equipment operating in two different clock domains depends upon the accuracy of the phase relationship predicted by the phase predictor. For example, accurate synchronization of the clocks operating at a cell tower and small cells are required to support the ever-increasing bandwidth requirements and to support accurate localization of mobile users, wherein the requirements may be below 5 ns total time error for a system. Measurement and industrial control systems also benefit from increasing the accuracy of clock time synchronization.

While phase predictors are known in the art, they do not provide the necessary accuracy required for modern equipment environments, they may support only a limited number of specific clock rates and they often involve complex and expensive implementation.

Accordingly, what is needed in the art is a phase predictor that provides an improved accuracy in predicting the phase relationship between two different clock signals, while also supporting different clock frequencies.

SUMMARY OF THE INVENTION

In accordance with various embodiments of the present invention, an improved system and method for predicting the phase relationship between two clock signals is provided. In particular, the present invention provides a system and method that increases the accuracy and resolution of the predicted phase relationship, while also supporting different clock frequencies.

In one embodiment, the present invention provides a method for predicting a phase difference between two clock signals. The method may include, determining an event clock cycle prediction of an event clock in an event clock domain relative to a system clock cycle in a system clock domain and emulating a predicted event clock in the system clock domain based upon the event clock cycle prediction. The method may further include, predicting a phase difference between the event clock and the system clock based upon the predicted event clock emulated in the system clock domain, wherein the phase difference is predicted at an edge of the system clock and is equal to a time between the edge of the system clock and a previous edge of the predicted event clock and aligning the predicted event clock emulated in the system clock domain with the event clock in the event clock domain based upon the predicted phase difference.

When aligning the event clock in the event clock domain with the predicted event clock emulated in the system clock domain, the method may further include, identifying an expected number of event clock predetermined edges based upon the phase difference. The method for aligning may further include, sampling a predetermined edge counter counting the predetermined edges of the event clocks in the event clock domain at a system clock edge to determine the number of predetermined edges of the event clock between each predetermined edge of the system clock, comparing the expected number of event clock predetermined edges to the number of predetermined edges of the event clock and realigning the predicted event clock with the system clock if the expected number of event clock predetermined edges does not match the number of predetermined edges of the event clock.

In another embodiment, a phase predictor is provided which may include, an event clock cycle predictor for receiving a system clock running in a system clock domain and an event clock running in an event clock domain, the event clock cycle predictor for determining an event clock cycle prediction of an event clock in an event clock domain relative to a system clock cycle in a system clock domain. The phase predictor may further include a phase difference predictor for emulating a predicted event clock in the system clock domain based upon the event clock cycle prediction, for predicting a phase difference between the event clock and the system clock, wherein the phase difference is predicted at an edge of the system clock and is equal to a time between the edge of the system clock and a previous edge of the predicted event clock and for aligning the predicted event clock emulated in the system clock domain with the system clock.

The phase difference between the event clock and the system clock may be used to adjust a generated timestamp for one or more data packets transmitted between the event clock domain and the system clock domain.

Accordingly, the present invention provides a phase predictor that provides an improved timestamp accuracy by predicting the phase relationship between two different clock signals, while also supporting different clock frequencies.

BRIEF DESCRIPTION OF THE DRAWINGS

The accompanying drawings, which are incorporated in and form a part of this specification, illustrate various embodiments and, together with the Description of Embodiments, serve to explain principles discussed below. The drawings referred to in this brief description should not be understood as being drawn to scale unless specifically noted.

DETAILED DESCRIPTION OF THE INVENTION

Reference will now be made in detail to various embodiments, examples of which are illustrated in the accompanying drawings. While various embodiments are discussed herein, it will be understood that they are not intended to be limiting. On the contrary, the presented embodiments are intended to cover alternatives, modifications, and equivalents, which may be included within the spirit and scope of the various embodiments as defined by the appended claims. Furthermore, in this Detailed Description of the Invention, numerous specific details are set forth in order to provide a thorough understanding. However, embodiments may be practiced without one or more of these specific details. In other instances, well known methods, procedures, components, and circuits have not been described in detail as not to unnecessarily obscure aspects of the described embodiments.

It will be understood that, although the terms first, second, third, etc., may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In accordance with various embodiments of the present invention, an improved system and method for predicting the phase relationship between two clock signals is provided. In particular, the present invention provides a system and method that increases the accuracy and resolution of the predicted phase relationship, while also supporting different clock frequencies.

In general, the present invention detects an event in a system clock domain and subtracts the time that has passed since the previous rising clock edge occurred in an event clock domain, thereby making the system clock domain aware of the duration in time from the previous rising clock edge in the event time domain at all times.

Figure 1:
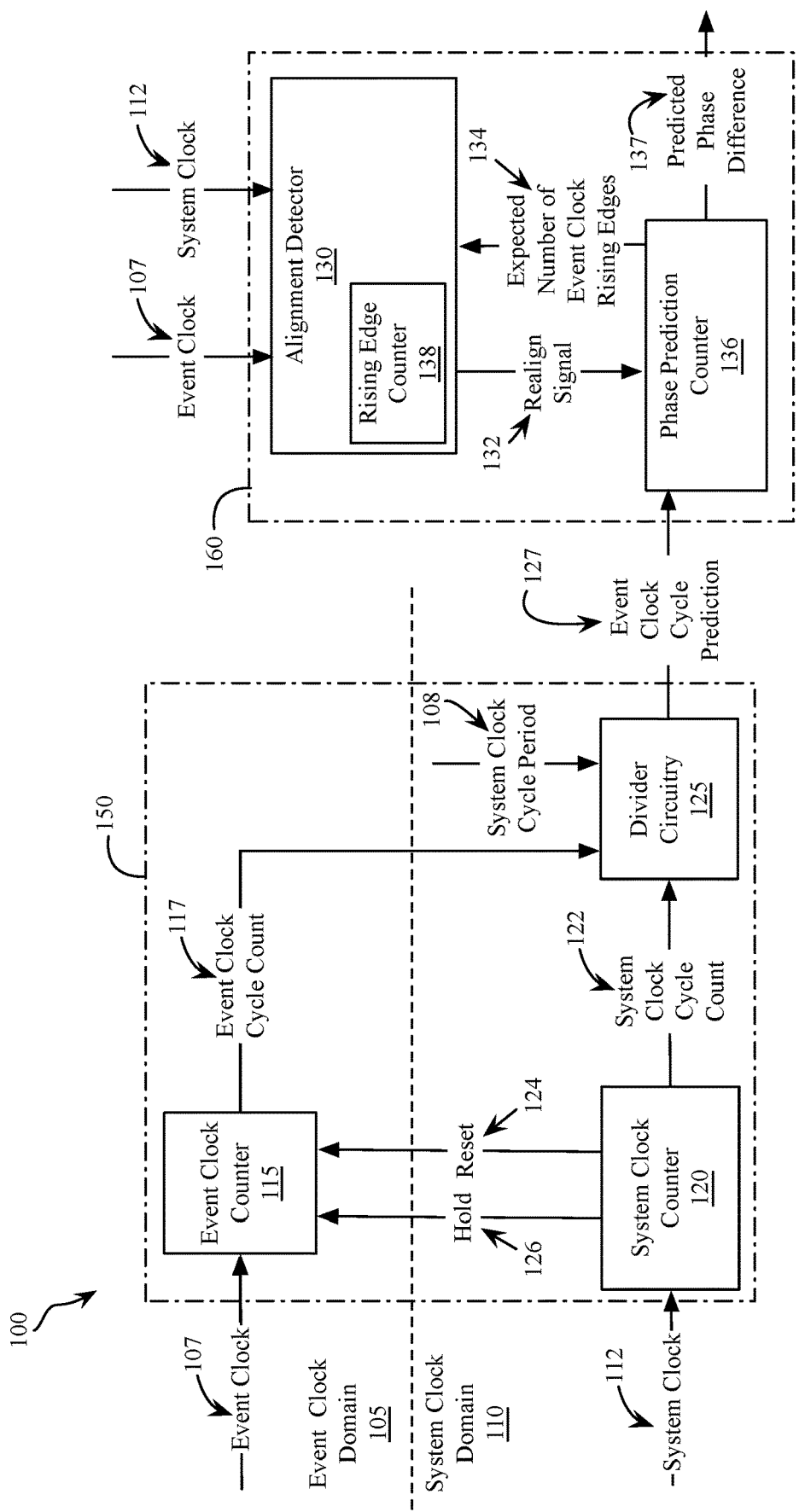
FIG. 1 is a block diagram illustrating a phase predictor, in accordance with an embodiment of the present invention.

With reference to FIG. 1, a phase predictor 100 is illustrated that accurately detects and predicts the phase relationship between two clocks that are running at different frequencies.

In this exemplary embodiment, the phase predictor 100 is used to accurately predict a predicted phase difference 137 between an event clock 107 running in an event clock domain 105 and a system clock 112 running in a system clock domain 110. The phase predictor 100 includes an event clock cycle predictor 150 and a phase difference predictor 160.

The event clock cycle predictor 150 comprises an event clock counter 115 operating in the event clock domain 105, a system clock counter 120 operating in the system clock domain 110 and divider circuitry 125 coupled to both the event clock counter 115 and the system clock counter 120. In various embodiment, the event clock cycle predictor 150 determines an event clock cycle prediction 127 that is used to emulate a predicted event clock in the system clock domain 110.

The phase difference predictor 160 comprises a phase prediction counter 136 and an alignment detector 130. The phase prediction counter 136 in combination with the alignment detector 130 provide the predicted phase difference 137 that can be used to adjust a timestamp of a frame in either the event clock domain 105 or the system clock domain 110, as will be described in more detail below.

In one embodiment, the event clock cycle prediction 127 is determined relative to one system clock cycle period and the event clock cycle prediction 127 is the time from an event clock edge to a previous event clock edge measured with a time unit equal to one cycle of system clock 112. In this embodiment, the system clock counter 120 counts cycles of the system clock 112 and outputs a number of system clock cycles 122 that occur during a counted number of event clock cycles 117, as counted by the event clock counter 115. The divider circuitry 125 divides the resulting event clock cycle count 117 by the system clock cycle count 122 to determine the event clock cycle prediction 127, wherein in this embodiment, the event clock cycle prediction 127 is the fractional number of event clock cycles that occur during each cycle of system clock 112. In an exemplary embodiment, if 221 clock cycles of system clock 112 are counted by the system clock counter 120 during the time that 128 clock cycles of event clock 107 are counted by the event clock counter 115, then the divider circuitry 125 will determine that the event clock cycle prediction 127 is equal to about 0.58 (128/221≅0.58) and, as such, there are about 0.58 event clock cycles during each system clock cycle.

In a second embodiment, the event clock cycle prediction 127 is determined relative to one event clock cycle period and the event clock cycle prediction 127 is the time from a system clock edge to a previous system clock edge measured with a time unit equal to one cycle of event clock 107. In this embodiment, the system clock counter 120 counts cycles of system clock 112 and outputs the number of system clock cycles 122 that occur during a counted number of event clock cycles 117 counted by the event clock counter 115. The divider circuitry 125 divides the resulting system clock cycle count 122 by the event clock cycle count 117 to determine the event clock cycle prediction 127, wherein in this embodiment, the event clock cycle prediction 127 is the number of system clock cycles that occur during each cycle of event clock 107. In an exemplary embodiment, if 221 clock cycles of system clock 112 are counted by the system clock counter 120 during the time that 128 clock cycles of event clock 107 are counted by the event clock counter 115, then the divider circuitry 125 will determine that the event clock cycle prediction 127 is equal to about 1.73 (221/128≅1.73) and, as such, there are about 1.73 system clock cycles during each event clock cycle.

In a third embodiment, the event clock cycle prediction 127 is determined relative to a known system clock cycle period 108 and the event clock cycle prediction 127 is the time from an event clock edge to a previous event clock edge determined in relation to the known system clock cycle period 108, measured in time units, which in an exemplary embodiment is expressed in nanoseconds. The system clock cycle period 108 is known by the divider circuitry 125 and is a constant value. In this embodiment, the system clock counter 120 counts cycles of system clock 112 and outputs the number of system clock cycles 122 that occur during a counted number of event clock cycles 117 counted and output by the event clock counter 115. The event clock cycle prediction 127 is determined by multiplying a ratio of the number of counted system clock cycles to the number of event clock cycles by the known system clock cycle period 108. In an exemplary embodiment, given that the system clock cycle period 108 is known to be 6.25 ns and 221 system clock cycles are counted during 128 event clock cycles, then the divider circuitry 125 will determine that the event clock cycle prediction 127 is equal to about 10.8 ns (221/128*6.2 ns≅10.8 ns).

In a particular embodiment, the rising edges of the event clock 107 and the system clock 112 may be used to count the event clock cycles, however this is not meant to be limiting in any way. In another embodiment the event clock counter 115 may be arranged to count a number of falling edges of the event clock 107, without exceeding the scope. In yet another embodiment both rising and falling edges may be counted, with divider circuitry 125 further dividing the result by two.

Additionally, the system clock counter 120, may utilize a hold signal 126 and a reset signal 124 to control the counting operations of the event clock counter 115. The system clock counter 120 may apply the hold signal 126 when the system clock count 122 provided by the system clock counter 120 reaches a predetermined number of system clocks. Upon application of the hold signal 126 the event clock counter 115 outputs the event clock cycle count 117. The hold signal 126 may also be used by the system clock counter 120 to output system clock cycle count 122 to divider circuitry 125. After the event clock counter 115 has provided the event clock cycle count 117, the reset signal 124 can be applied by the system clock counter 120 to clear the event clock counter 115 and the system clock counter 120. The hold signal 126 may then be released, thereby restarting the event clock counter 115 and the system clock counter 120. By controlling the counting operations of the event clock counter 115 responsive to the system clock counter 120, the event clock cycle prediction 127 will be updated continuously.

The event clock cycle prediction 127 is provided to the phase difference predictor 160 of the phase predictor 100. The phase difference predictor 160 uses the event clock cycle prediction 127 provided by the divider circuitry 125 to output a predicted phase difference 137 which represents the predicted change in phase difference between the event clock 107 and the system clock 112. A predicted phase difference 137 is predicted by the phase difference predictor 160 for each cycle of the system clock 112. Phase difference predictor 160 includes a phase prediction counter 136 and an alignment detector 130 and provides predicted phase difference 137 between the event clock 107 and the system clock 112 as an output.

Figure 2A:
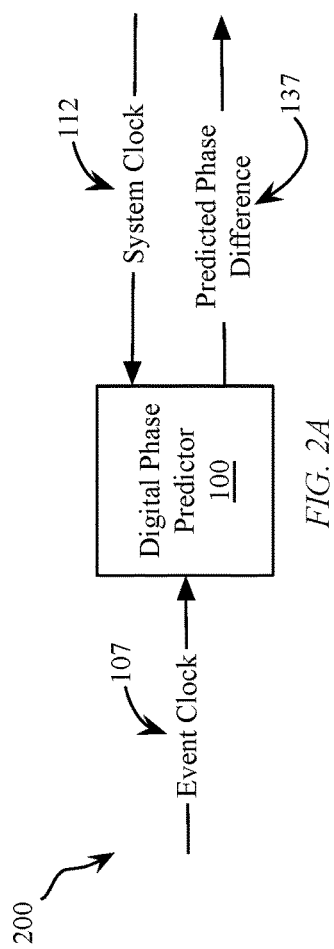
FIG. 2A is a block diagram illustrating the inputs and outputs of a phase predictor, in accordance with an embodiment of the present invention.

FIG. 2A illustrates the phase predictor 100 which takes as input, the event clock 107 and the system clock 112 and provides the predicted phase difference between the event clock 107 and the system clock 112 as the predicted phase difference 137 at the output.

Figure 2B:
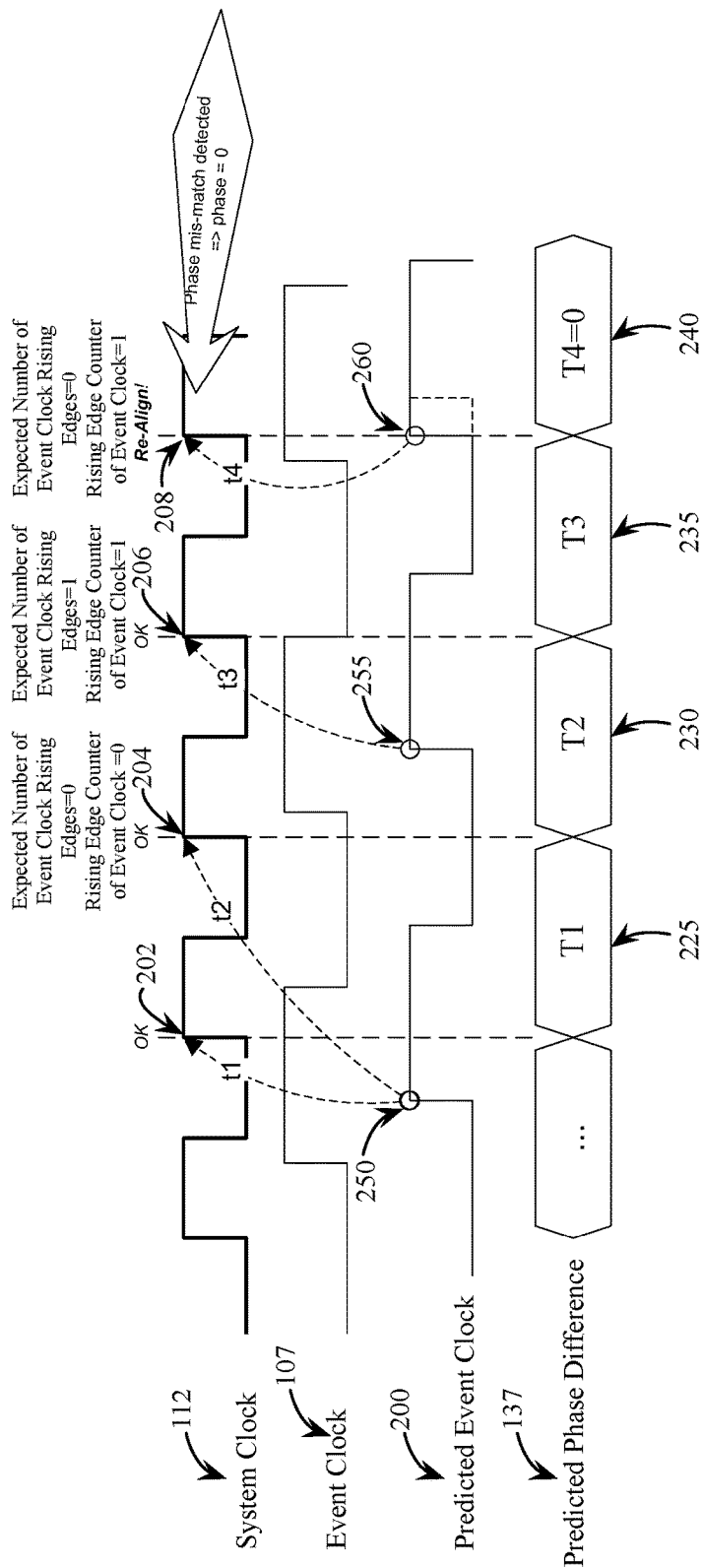
FIG. 2B is a timing diagram illustrating detection and synchronization of the clock signals, in accordance with an embodiment of the present invention.

FIG. 2B illustrates an exemplary timing diagram for the system clock 112, the event clock 107, a graphical representation of a predicted event clock 200, which corresponds to the event clock cycle prediction 127, and the predicted phase difference 137 between the system clock 112 and the event clock 107.

In order to accurately predict the phase difference 137 between the system clock 112 and the event clock 107, a predicted event clock 200 is emulated by the phase prediction counter 136 within the system clock domain 110 that is based upon the event clock cycle prediction 127 determined by the event clock cycle predictor 150. In accordance with the first embodiment previously described the phase prediction counter 136 is incremented with the latest event clock cycle prediction 127 every system clock cycle. If the value of the incremented phase prediction counter 136 becomes larger than "1", representing one event clock period, the value is divided by one and the value is set to the modulo value and the quotient of the division remains representing the expected number of event clock rising edges 134. The predicted event clock 200 is not a physical clock signal but is instead an emulated clock signal, represented by a predicted phase value, in which it is desired to know a phase for all rising edges of the event clock 107 in the system clock domain 110.

In accordance with first embodiment previously described, wherein the event clock cycle prediction 127 is based upon the fractional number of event clock cycles per system clock cycle, the predicted event clock 200 in the system clock domain 110 is emulated by the phase prediction counter 136 of FIG. 1 using the event clock cycle prediction 127. The phase prediction counter 136 stores a current phase prediction value and the phase prediction value is incremented with the latest event clock cycle prediction 127 every system clock cycle. As such, the phase prediction counter 136 predicts the phase difference 137 between the event clock 107 and the system clock 112 based upon a current phase prediction value of the phase prediction counter 136 and the value of the event clock cycle prediction 127.

In this first embodiment, when the system clock 112 has a rising edge 202, it is known that a previous rising edge 250 of the predicted event clock 200 occurred at a time (t1) prior to the rising edge 202 of the system clock 112. As such, in this embodiment, the predicted phase difference 137 between the system clock 112 and the event clock 107 during a first system clock cycle 225 is measured in event clock cycles, where one event clock cycle is equal to a value of 1. In this embodiment, the state of the phase difference during a system clock cycle is predicted to be equal to a previous state plus the fractional number of event clock cycles per system clock cycle.

In addition to determining a current state of the predicted phase difference 137, the phase difference predictor 160 also aligns the predicted event clock 200 with the event clock 107. This is controlled by the alignment detector 130. To align the predicted event clock 200 with the event clock 107, the event clock 107 drives an edge counter 138 of the alignment detector 130 that changes value on each event clock predetermined edge. In one embodiment, the edge counter 138 is a gray code counter, and in an exemplary embodiment counts rising edges. The edge counter 138 of alignment detector 130 is sampled at each rising edge of the system clock 112 and the number of counter increments, e.g. rising edges of event clocks since the last counter sample, is compared to the expected number event clock rising edges 134. If the expected number of event clock rising edges 134 does not match the number of rising edges seen on the event clock 107, the predicted event clock 200 is realigned with the system clock 112 by setting the predicted phase difference 137 to zero.

The expected number of event clock rising edges 134 is determined by the phase prediction counter 136 and is based upon the predicted phase difference 137 provided by the phase prediction counter 136. The phase prediction counter 136 determines when the predicted event clock 200 experiences clock cycle rollovers, wherein in one embodiment, a clock cycle rollover occurs when the addition of the event clock cycle prediction 127 to the current predicted phase difference 137 results in a value that exceeds the event clock period. The number of rollovers represent the expected number of event clock rising edges 134 and is the quotient when dividing the resulting value with the event clock period. The new value of the predicted phase difference 137 is the resulting value modulo the event clock period. In one embodiment, when it is determined by the phase prediction counter 136 that the predicted event clock 200 will not experience a clock cycle rollover based upon the predicted phase difference 137, the expected number of event clock rising edges 134 may be set to a zero, indicating that the predicted event clock 200 is not expected to have any rising edges during the next cycle of the system clock 112. Additionally, when it is determined by the phase prediction counter 136 that the predicted event clock 200 will experience one or more clock cycle rollovers, the expected number of event clock rising edges 134 may be set to a value, indicating that the event clock 107 is expected to have one or more rising edges during the next cycle of the system clock 112. Additional details regarding the method by which the phase prediction counter 136 determines the expected number of event clock rising edges 134 are provided below.

The expected number of event clock rising edges 134 is provided to alignment detector 130. In the alignment detector 130 the event clock 107 is driving a small gray code counter that changes value on each event clock rising edge. The alignment detector 130 samples the value of the gray code counter at the rising edge of every system clock cycle and compares the sampled value of the gray code counter with the last sampled value of the gray code counter to determine the number of rising edges that has occurred within the last system clock cycle. This value is compared to the expected number of event clock rising edges 134 and if the values do not match the predicted event clock 200 needs to be realigned with the event clock 107. In this case the alignment detector 130 sends a realign signal 132 to the phase prediction counter 136 to reset the predicted phase difference 137 to zero to realign the predicted event clock 200 with the rising edge of the system clock 112.

In other embodiments the number of rising edges on the event clock can be determined by sampling the level of the event clock at each system clock rising edge and comparing the sampled value with previous samples values. It is to be understood that while clock rising edges are described herein, the use of falling edges may be substituted for rising edges without exceeding the scope. Thus, any predetermined edge may be utilized, and edge counter 138 may count falling edges.

As illustrated in FIG. 2B, during a first system clock cycle, between a first rising edge 202 of the system clock 112 and a second rising edge 204 of the system clock 112, the state (T1) 225 of the predicted phase difference 137 is predicted in modular arithmetic as T1=(t0+d)mod 1, wherein d is equal to the number of event clock cycles 107 per each system clock cycle 112, e.g. the event clock cycle prediction 127. It is assumed that the system clock 112 and the event clock 107 are aligned at time t0 and therefore, T1=(0+0.58)mod 1. In accordance with modular arithmetic, "mod 1" indicates that one event clock cycle is equal to a value of 1 in the phase difference and the phase difference starts over when the phase difference exceeds the modulo value of 1, thereby indicating one or more clock cycle rollovers of the predicted event clock 200. The expected number of rollovers is determined by division (t0+d)/1 and the expected number of event clock rising edges 134 is equal to the quotient. As such, the predicted phase difference 137 during the first clock cycle is T1=0.58, which is provided as an output from the phase difference predictor 160 as predicted phase difference 137. At T 1, the predicted phase difference 137 has not exceeded the modulo value of 1 and the expected number of rollovers is determined by the quotient of division (t0+d)/1=0, thereby indicating that the predicted event clock 200 will not experience a clock cycle rollover during the next cycle of the system clock 112 (between a first rising edge 202 and a second rising edge 204 of the system clock 112). The expected number of event clock rising edges 134 is therefore set to 0. The expected number of event clock rising edges 134 is compared to the actual number of rising edges of the event clock 107 at the rising edge 204 of the system clock 112 to determine if the predicted event clock 200 needs to be realigned.

At a next state (T2) 230, when the system clock 112 has a second rising edge 204, it is known that a previous rising edge 250 of the predicted event clock 200 occurred at a time (t2) prior to the rising edge 204 of the system clock 112. As such, state (T2) 230 of the phase difference 137 during the second clock cycle is predicted as T2=(t1+d)mod 1=(0.58+0.58)mod 1=(1.16)mod 1=0.16. At T2, the expected number of rollovers is determined by the quotient of division (t1+d)/1=(0.58+0.58/1)=1.16, so the quotient is 1, thereby indicating that the predicted event clock 200 has experienced a clock cycle rollover and one rising edge is expected on the event clock 107 during the next cycle of the system clock 112 (between the second rising edge 204 and the third rising edge 206 of the system clock 112). The phase prediction counter 136 sets the expected number of event clock rising edges 134 to "1" to indicate that the predicted event clock 200 experienced a cycle clock rollover. The phase prediction counter 136 sends the expected number of event clock rising edges 134 to the alignment detector 130 and at the clock rising edge 206 the alignment detector 130 compares the value of expected number of event clock rising edges 134 with the actual number of rising edges of the event clock 107 to determine if the predicted event clock 200 needs to be realigned with the system clock 112. At the rising edge 206 of the system clock 112, the actual number of rising edges of the event clock 107 is found to be 1 and the expected number of event clock rising edges 134 is also 1. Since the actual number of rising edges of the event clock 107 and the expected number of event clock rising edges 134 match, it is not necessary to realign the predicted event clock 200 with the system clock 112 at rising edge 206.

At a next state 235, when the system clock 112 has a next rising edge 206, T3=(t2+d)mod 1=(0.16+0.58)mod 1=0.74. The expected number of rising edges is determined by the quotient of division (t1+d)/1=(0.16+0.58/1)=0.74, so the quotient is 0, thereby indicating that the predicted event clock 200 will not have any rising edges during state 235. The phase prediction counter 136 sets the expected number of event clock rising edges 134 to "0", to indicate that the predicted event clock 200 is not expected to have any rising edges during the next cycle of the system clock 112 (the cycle following the rising edge 206) and sends the expected number of event clock rising edges 134 to the alignment detector 130. The alignment detector 130 compares actual number of rising edges of the event clock 107 to the expected number of event clock rising edges 134, at the rising edge 208 of the system clock 112, to determine if the predicted event clock 200 needs to be realigned with the system clock 112. At the rising edge 208 of the system clock 112, the actual number of rising edges of the event clock 107 is found to be 1. Since the value of the actual number of rising edges of the event clock 107 differs from the expected number of event clock rising edges 134, it is necessary to realign the predicted event clock 200 with the system clock 112 at state T4. As such, the alignment detector 130 sends a realign signal 132 to the phase prediction counter 136 and the phase prediction counter 136 sets the phase difference 137 to zero.

In the second embodiment, wherein the event clock cycle prediction 127 is determined relative to one system clock cycle period and the event clock cycle prediction 127 is the time from an event clock edge to a previous event clock edge measured with a time unit equal to one system clock cycle, the event clock cycle prediction 127 at state T1 is determined to be equal to about 1.73 (221/128≅1.73) and, as such, there are about 1.73 system clock cycles during each event clock cycle, thereby indicating a modulus of 1.73. In accordance with this embodiment, and with reference to FIG. 2B, the respective predicted phase differences 137 are found to be, T1=(t0+1)mod 1.73=1, T2=(1+1)mod 1.73=0.27, T3=(0.27+1)mod 1.73=1.27, T4=(1.27+1)mod 1.73=0.54. Similar to the first embodiment, since the quotient of the division with 1.73 is "0" at T1 and T3 and "1" at T2, the actual number of rising edges of the event clock 107 and the expected number of event clock rising edges 134 are compared by alignment detector 130 at the rising edge of the system clock 112. At rising edge 204 and 206, the number of rising edges of the event clock 107 and the expected number of event clock rising edges 134 are found to match, so no realignment of the predicted event clock 200 is performed. However, at rising edge 208, the number of rising edges of the event clock 107 and the expected number of event clock rising edges 134 do not match, and as such, the predicted event clock 200 is realigned with the system clock 112 and the phase difference 137 it set to zero.

In the third embodiment, wherein the event clock cycle prediction 127 is determined relative to a known system clock cycle period and the event clock cycle prediction 127 is the time from an event clock edge to a previous event clock edge measured with a time unit in nanoseconds, given that the system clock cycle period is equal to 6.25 ns, the event clock cycle prediction 127 is determined to be equal to about 10.8 ns (221/128*6.2 ns 10.8 ns). In accordance with this embodiment, and with reference to FIG. 2B, the predicted phase differences 137 are found to be, T1=(t0+6.25 ns)mod 10.8 ns=6.25 ns, T2=(6.25 ns+6.25 ns)mod 10.8 ns=1.7 ns, T3=(1.7 ns+6.25)mod 10.8 ns=7.95 ns, T4=(7.95 ns+6.25)mod 10.8 ns=3.4 ns. Similar to the first and second embodiments, the quotient of the division with 10.8 is "0" at T1 and T3 and "1" at T2. The expected number of event clock rising edges 134 are compared to the actual number of rising event clock edges detected by the alignment detector 130 at the rising edge of each system clock 112. At rising edge 204 and 206, the actual number of rising edges of the event clock 107 and the expected number of event clock rising edges 134 are found to match, so no realignment of the predicted event clock 200 is performed. However, at rising edge 208, the actual number of event clock rising edges and the expected number of event clock rising edges 134 do not match, and as such, the predicted event clock 200 is realigned with the system clock 112 and the phase difference 137 it set to zero.

In general, initially the predicted phase difference will not be correct, because the actual phase difference between the system clock 112 and the event clock 107 is not known. However, by comparing the number of rising edges of the event clock 107 between each rising edge of the system clock 112 with the expected number of event clock rising edges 134 it is possible to detect when the phase difference between the event clock and the system clock does not match the predicted phase difference 137 from the phase prediction counter 136. This automatic realignment ensures that the predicted phase difference value is very quickly within picoseconds of the actual phase difference.

The predicted phase difference 137 from the phase predictor 100 of the present invention can be used to handle timing event information in the system clock domain 110 for events that have taken place in the event clock domain 105. In a particular embodiment, the predicted phase difference output 137 from the phase predictor 100 can be used to support high accuracy timestamping in multi-clock domain hardware which requires the ability to evaluate when an event occurred in another clock domain than the one in which the timestamp is being used. With the present invention, getting the available timing information into the system clock domain 110 is achieved by emulating a predicted event clock 200 in the system clock domain 110, and as the phase relationship between the two clock domains is known from the phase predictor the timestamping accuracy provided can be much higher than the clock period of the system clock domain 110.

In a particular example, in the case of Ethernet switches and at the physical layer (PHY) of the Ethernet switch, the predicted phase difference output 137 can be used to record the transmission and reception times of transmitted Ethernet frames with a very high accuracy. The transmission and reception times are commonly used in PTP (Precision Time Protocol, IEEE 1588) to transfer time between equipment, and the accuracy of the time transfer directly depends upon the accuracy of the timestamps.

PTP can be used to synchronize equipment in many different applications having different synchronization requirements, including cell towers and measurement and industrial control systems. The ability to very accurately synchronize the time of equipment connected over Ethernet is also expected to feed a number of new applications in the art.

Figure 3:
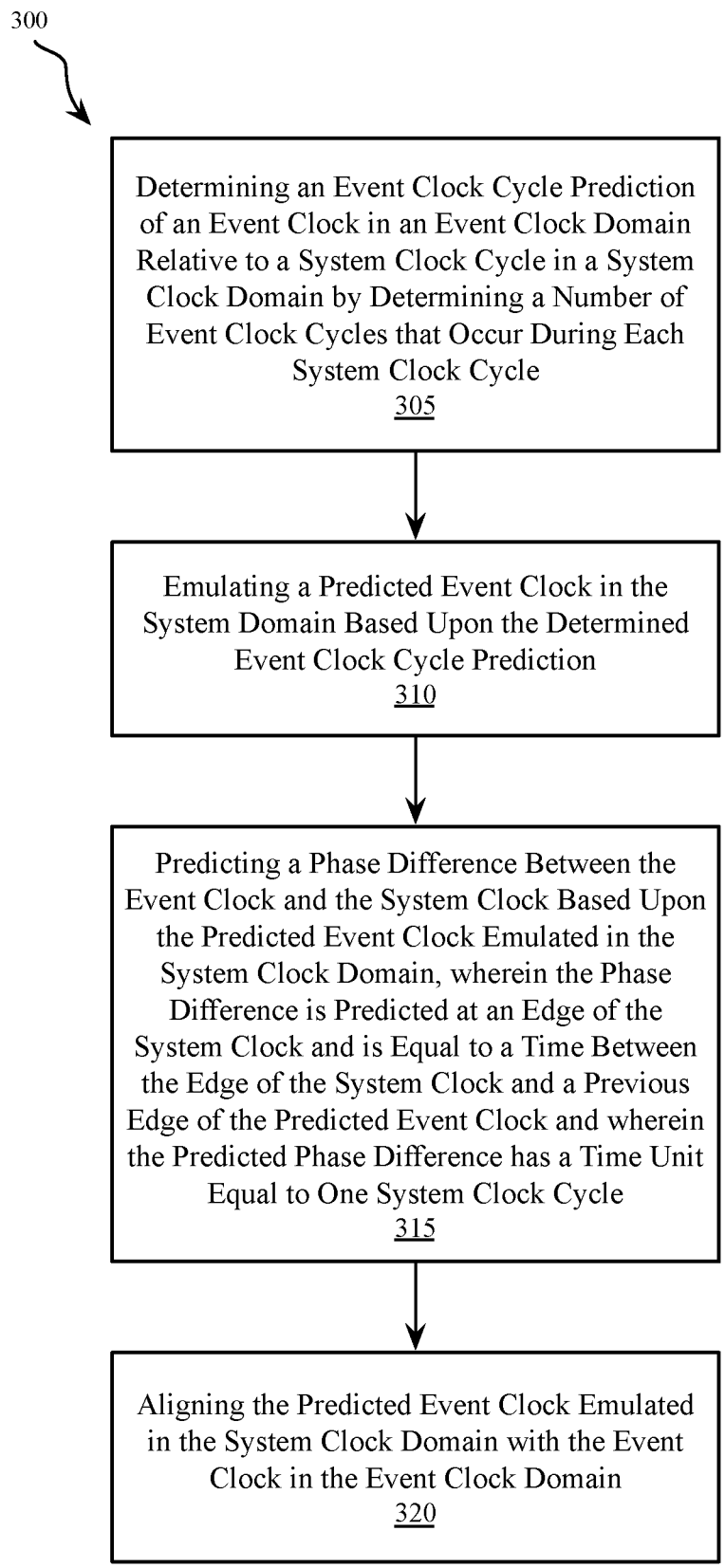
FIG. 3 is a flow diagram illustrating a method for predicting a phase difference between an event clock signal and a system clock signal, which includes determining a number of event clock cycles that occur during each system clock cycle, in accordance with an embodiment of the present invention.

FIG. 3A illustrates a flow diagram of the method 300 for predicting a phase difference between two clock signals, wherein the phase difference has a time unit equal to one system clock cycle. The method includes a first step 305 for determining an event clock cycle prediction of an event clock in an event clock domain relative to a system clock cycle in a system clock domain by determining a number of event clock cycles that occur during each system clock cycle. Determining the event clock cycle prediction may be accomplished by the event clock cycle predictor 150 of the phase predictor 100, as described with reference to FIG. 1.

In a next step 310, the method includes emulating a predicted event clock in the system domain based upon the determined event clock cycle prediction. The phase prediction counter 136 of the phase difference predictor 160, as described with reference to FIG. 1 can be used to emulate the predicted event clock.

At step 315, the method includes predicting a phase difference between the event clock and the system clock based upon the predicted event clock emulated in the system clock domain, wherein the phase difference is predicted at an edge of the system clock and is equal to a time between the edge of the system clock and a previous edge of the predicted event clock and wherein the predicted phase difference has a time unit equal to one system clock cycle. The phase prediction counter 136 of FIG. 1 can be used to predict the phase difference between the event clock and the system clock based upon the current value of the phase prediction counter 136 and the value of the event clock cycle prediction 127.

At step 320, the method includes aligning the predicted event clock emulated in the system clock domain with the event clock in the event clock domain based upon the predicted phase difference. The phase prediction counter 136 and the alignment detector 130 of the phase difference predictor 160, described with reference to FIG. 1, can be used to align the predicted event clock with the event clock in the event clock domain.

Figure 4:
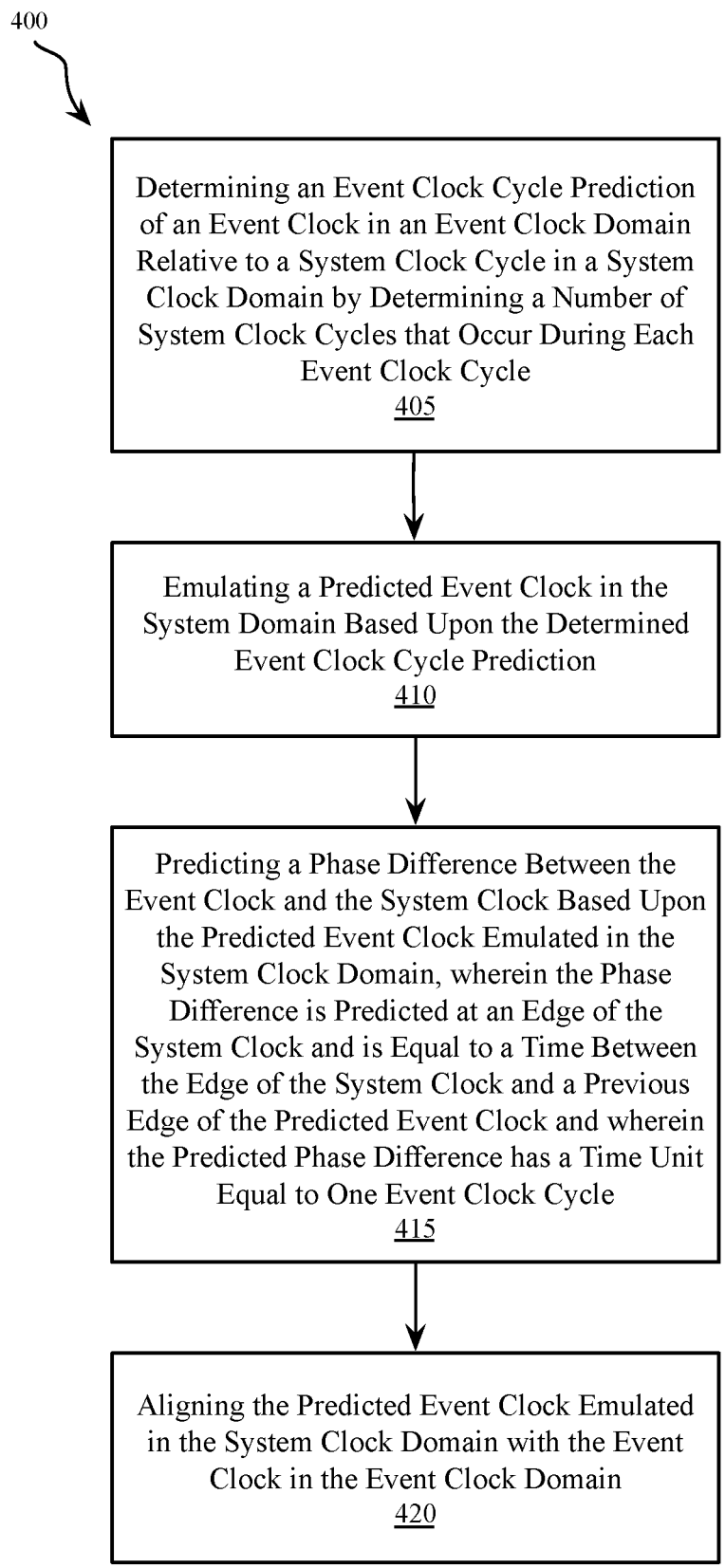
FIG. 4 is a flow diagram illustrating a method for predicting a phase difference between an event clock signal and a system clock signal, which includes determining a number of system clock cycles that occur during each event clock cycle, in accordance with an embodiment of the present invention.

FIG. 4 illustrates a flow diagram of the method 400 for predicting a phase difference between two clock signals, wherein the phase difference has a time unit equal to one event clock cycle. The method includes a first step 405 for determining an event clock cycle prediction of an event clock in an event clock domain relative to a system clock cycle in a system clock domain by determining a number of system clock cycles that occur during each event clock cycle. Determining the event clock cycle prediction may be accomplished by the event clock cycle predictor 150 of the phase predictor 100, as described with reference to FIG. 1.

In a next step 410, the method includes emulating a predicted event clock in the system domain based upon the determined event clock cycle prediction. The phase prediction counter 136 of the phase difference predictor 160, as described with reference to FIG. 1 can be used to emulate the predicted event clock.

At step 415, the method includes predicting a phase difference between the event clock and the system clock based upon the predicted event clock emulated in the system clock domain, wherein the phase difference is predicted at an edge of the system clock and is equal to a time between the edge of the system clock and a previous edge of the predicted event clock and wherein the predicted phase difference has a time unit equal to one event clock cycle. The phase prediction counter 136 of FIG. 1 can be used to predict the phase difference between the event clock and the system clock based upon the current value of the phase prediction counter 136 and the value of the event clock cycle prediction 127.

At step 420, the method includes aligning the predicted event clock emulated in the system clock domain with the event clock in the event clock domain based upon the predicted phase difference. The phase prediction counter 136 and the alignment detector 130 of the phase difference predictor 160, described with reference to FIG. 1, can be used to align the predicted event clock with the event clock in the event clock domain.

Figure 5:
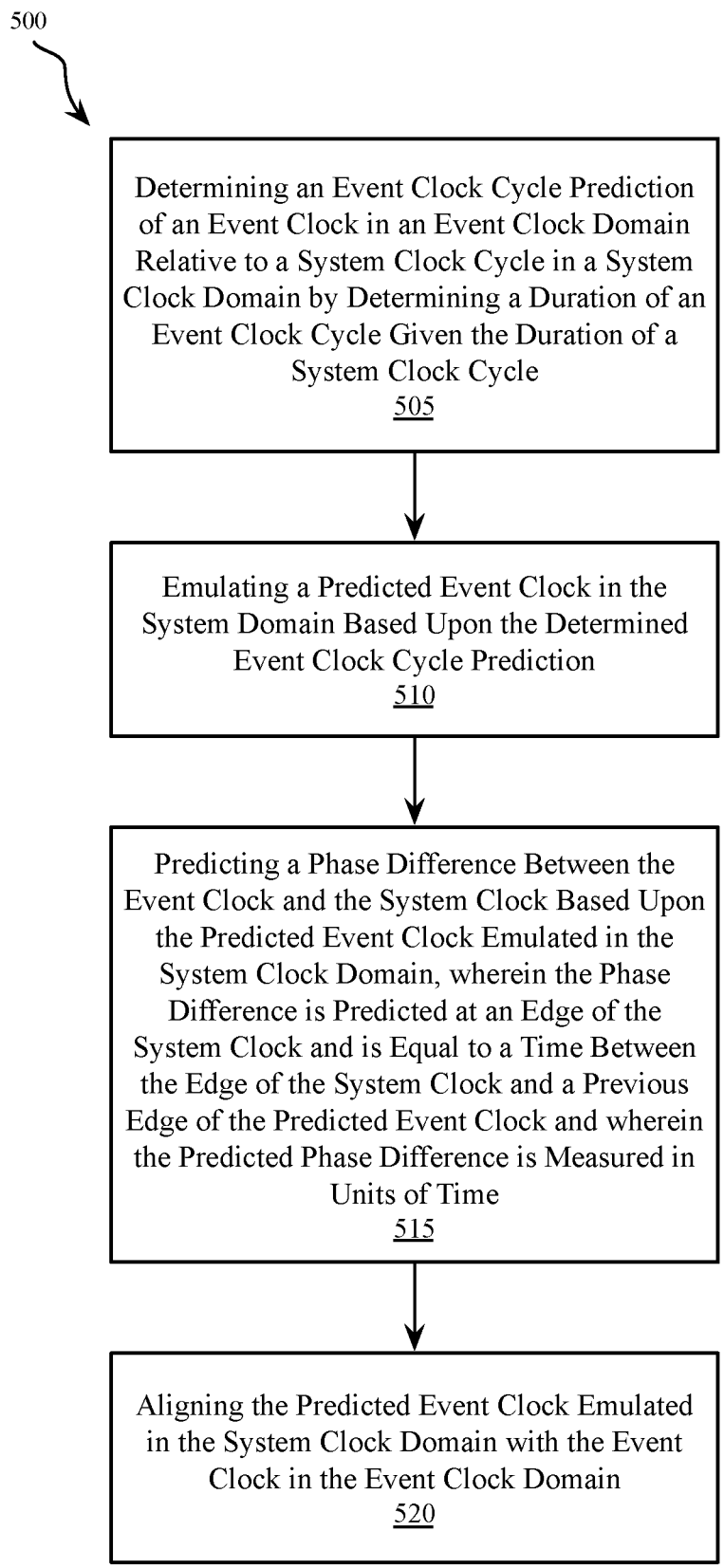
FIG. 5 is a flow diagram illustrating a method for predicting a phase difference between an event clock signal and a system clock signal, which includes determining a duration of an event clock cycle given the duration of a system clock cycle, in accordance with an embodiment of the present invention.

FIG. 5 illustrates a flow diagram of the method 500 for predicting a phase difference between two clock signals, wherein the phase difference is measured in units of time. The method includes a first step 505 for determining an event clock cycle prediction of an event clock in an event clock domain relative to a system clock cycle in a system clock domain by determining a duration of an event clock cycle given the duration of a system clock cycle. Determining the event clock cycle prediction may be accomplished by the event clock cycle predictor 150 of the phase predictor 100, as described with reference to FIG. 1.

In a next step 510, the method includes emulating a predicted event clock in the system domain based upon the determined event clock cycle prediction. The phase prediction counter 136 of the phase difference predictor 160, as described with reference to FIG. 1 can be used to emulate the predicted event clock.

At step 515, the method includes predicting a phase difference between the event clock and the system clock based upon the predicted event clock emulated in the system clock domain, wherein the phase difference is predicted at an edge of the system clock and is equal to a time between the edge of the system clock and a previous edge of the predicted event clock and wherein the predicted phase difference is measured in units of time. The phase prediction counter 136 of FIG. 1 can be used to predict the phase difference between the event clock and the system clock based upon the current value of the phase prediction counter 136 and the value of the event clock cycle prediction 127.

At step 520, the method includes aligning the predicted event clock emulated in the system clock domain with the event clock in the event clock domain based upon the predicted phase difference. The phase prediction counter 136 and the alignment detector 130 of the phase difference predictor 160, described with reference to FIG. 1, can be used to align the predicted event clock with the event clock in the event clock domain.

Figure 6:
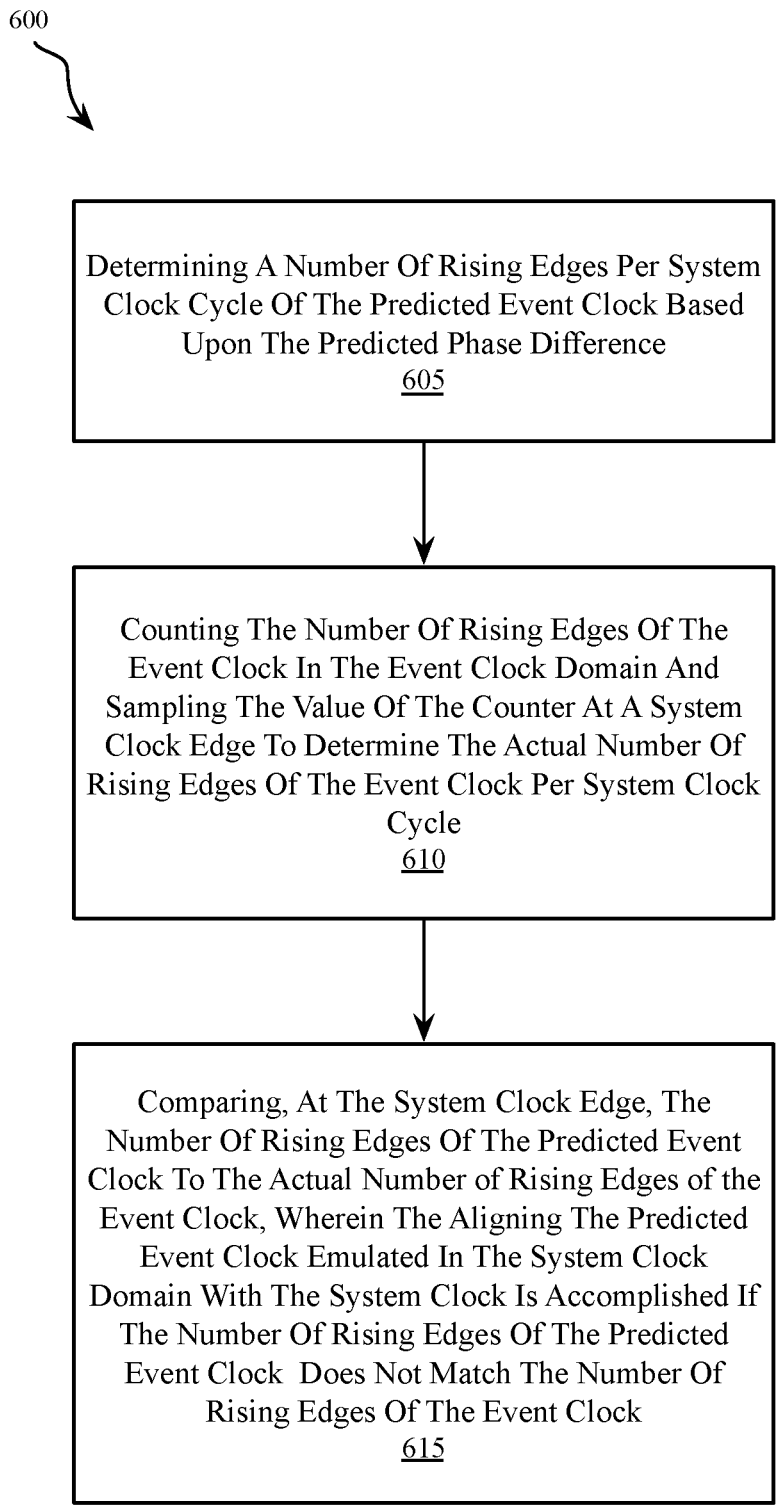
FIG. 6 is a flow diagram illustrating a method for aligning a predicted event clock emulated in the system clock domain with the event clock in the event clock domain, in accordance with an embodiment of the present invention.

Details of the alignment step 320, 420 and 520 performed by the alignment detector 130 are further illustrated with reference to FIG. 6, wherein FIG. 6 illustrates a flow diagram of a method 600 for aligning the predicted event clock emulated in the system clock domain with the event clock in the event clock domain based upon the predicted phase difference. The method includes a first step 605 for determining a number of predetermined edges (e.g. rising or falling edges) per system clock cycle of the predicted event clock based upon the predicted phase difference.

In a next step 610, the method includes counting the number of predetermined edges of the event clock in the event clock domain and sampling the value of the counter at a system clock edge to determine the actual number of predetermined edges of the event clock per system clock cycle.

At step 615, the method includes comparing, at the system clock edge, the number of predetermined edges of the predicted event clock to the actual number of predetermined edges of the event clock, wherein the predicted event clock emulated in the system clock domain is aligned with the system clock if the number of predetermined edges of the predicted event clock matches the number of predetermined edges of the event clock, and a re-alignment action need not be performed. If the number of predetermined edges of the predicted event clock does not match the number of predetermined edges of the event clock, the predicted event clock is re-aligned by aligning the predicted clock rising edge with the system clock rising edge, e.g. setting the predicted phase difference between the event clock and the system clock to zero.

The embodiments of the present invention more accurately detect and predict the phase relationship between the system clock driving the PTP time and the RX (reception) and TX (transmission) event clocks driving each physical Ethernet port. The PTP logic generates the RX and TX timestamps in the system clock domain when a PTP frame is detected. When the PTP frame passes the connector of the system clock domain, there are differences between the actual time the frame enters/exists the system clock domain and the time where the PTP logic generates the RX/TX timestamps. The phase predictor 100 results of the present invention are used together with the known latency of the PHY to adjust the timestamp captured by the PTP logic and to generate the real PTP timestamp to be used in the PTP frame. In some implementations, the phase predictor 100 may be used to transfer the PTP time from the system clock domain to the event clock domain and perform the PTP frame modifications in the event clock domain, such as in an Ethernet MAC.

IEEE 1588 is commonly used to synchronize equipment and the accuracy of the synchronization heavily depends upon the timestamp accuracy of the Ethernet switches and PHYs used in the equipment. With the system and method of the present invention, it is possible to synchronize the ends points to an accuracy that allows many new applications including 5G telecom network synchronization and the synchronization of multiple measurement devices. The 1588 protocol transfers frame data wherein each node being passed on the way from the master in the system domain to the slave in the event domain must update fields with in-flight times seen in the node. As such, the node must be able to tell that a frame has taken exactly 1.235187 micro seconds, as a non-limiting example, to pass through, with an accuracy of 1 nanosecond. Without the present invention, it would only be possible to tell that the frame was in flight between 1.23 and 1.25 micro seconds, i.e. with an accuracy of +/−20 nanoseconds. Accordingly, the time stamping accuracy provided by the system of the present invention is an important feature for Ethernet switches and PHYs.

Additionally, the phase predictor 100 implementation of the present invention is a pure digital function and can be used in other applications where the phase between clocks needs to be known. The phase predictor 100 of the present invention provides phase values between the system clock and an event clock, with very high accuracy (picosecond level). The phase predictor 100 may be implemented as pure RTL logic and is therefore easy to integrate into different circuit designs. The invention automatically adjust to frequency fluctuations, requires very little configuration and no calibration. The invention automatically measures and compensates for frequency drift between clocks and as such, the clocks do not need to be synchronized together. Accordingly, a system designed with the phase detector and predictor 100 of the present invention can support very high accuracy PTP timestamping without the need for SyncE (Synchronous Ethernet) or analog Phase Locked Loops (PLLs).

In one embodiment, portions of the phase predictor may be implemented in an integrated circuit as a single semiconductor die. Alternatively, the integrated circuit may include multiple semiconductor die that are electrically coupled together such as, for example, a multi-chip module that is packaged in a single integrated circuit package.

In various embodiments, portions of the system of the present invention may be implemented in a Field Programmable Gate Array (FPGA) or Application Specific Integrated Circuit (ASIC). As would be appreciated by one skilled in the art, various functions of circuit elements may also be implemented as processing steps in a software program. Such software may be employed in, for example, a digital signal processor, a network processor, a microcontroller or general-purpose computer.

Unless specifically stated otherwise as apparent from the discussion, it is appreciated that throughout the description, discussions utilizing terms such as "receiving", "determining", "generating", "limiting", "sending", "counting", "classifying", or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present invention may be embodied on various computing platforms that perform actions responsive to software-based instructions. The following provides an antecedent basis for the information technology that may be utilized to enable the invention.

The method of the present invention may be stored on a computer readable medium which may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any non-transitory, tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. However, as indicated above, due to circuit statutory subject matter restrictions, claims to this invention as a software product are those embodied in a non-transitory software medium such as a computer hard drive, flash-RAM, optical disk or the like.

Program code embodied on a computer readable medium may be transmitted using any appropriate medium, including but not limited to wireless, wire-line, optical fiber cable, radio frequency, etc., or any suitable combination of the foregoing. Computer program code for carrying out operations for aspects of the present invention may be written in any combination of one or more programming languages, including an object-oriented programming language such as Java, C#, C++, Visual Basic or the like and conventional procedural programming languages, such as the "C" programming language or similar programming languages.

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Further, for purposes of discussing and understanding the embodiments of the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

What we claim is:

1. A method for predicting a phase difference between two clock signals, the method comprising:
    determining an event clock cycle prediction of an event clock in an event clock domain relative to a system clock cycle in a system clock domain;
    emulating a predicted event clock in the system clock domain based upon the determined event clock cycle prediction;
    predicting a phase difference between the event clock and the system clock based upon the predicted event clock emulated in the system clock domain, wherein the phase difference is predicted at an edge of the system clock and is equal to a time between the edge of the system clock and a previous edge of the predicted event clock; and
    aligning the predicted event clock emulated in the system clock domain with the event clock in the event clock domain based upon the predicted phase difference.

2. The method of claim 1, wherein determining the event clock cycle prediction of the event clock in the event clock domain relative to the system clock cycle in the system clock domain further comprises, determining a number of event clock cycles that occur during each system clock cycle and wherein the phase difference has a time unit equal to one system clock cycle.

3. The method of claim 1, wherein determining the event clock cycle prediction of the event clock in the event clock domain relative to the system clock cycle in the system clock domain further comprises, determining a number of system clock cycles that occur during each event clock cycle and wherein the phase difference has a time unit equal to one event clock cycle.

4. The method of claim 1, wherein a duration of the system clock cycle is known and wherein determining the event clock cycle prediction of the event clock in the event clock domain relative to the system clock cycle in the system clock domain further comprises, determining a duration of an event clock cycle given the duration of a system clock cycle and wherein the phase difference is measured in units of time.

5. The method of claim 1, wherein determining the event clock cycle prediction of the event clock in the event clock domain relative to the system clock cycle in the system clock domain further comprises counting a number of system clock cycles occurring in the system clock domain during a number of event clock cycles counted in the event clock domain.

6. The method of claim 1, wherein aligning the predicted event clock emulated in the system clock domain with the event clock in the event clock domain further comprises:
    determining a number of predetermined edges per system clock cycle of the predicted event clock based upon the predicted phase difference;
    counting the number of predetermined edges of the event clock in the event clock domain and sampling the value of the counter at a system clock edge to determine the actual number of predetermined edges of the event clock per system clock cycle;
    comparing, at the system clock edge, the number of predetermined edges of the predicted event clock to the actual number of predetermined edges of the event clock; and
    re-aligning the predicted event clock emulated in the system clock domain with the system clock if the number of predetermined edges of the predicted event clock does not match the number of predetermined edges of the event clock.

7. The method of claim 6, wherein re-aligning the predicted event clock emulated in the system clock domain with the system clock further comprises setting the predicted phase difference to zero if the number of predetermined edges of the predicted event clock does not match the number of predetermined edges of the event clock.

8. The method of claim 6, wherein determining an expected number of event clock predetermined edges based upon the predicted phase difference further comprises identifying clock cycle rollovers of the predicted event clock from the predicted phase difference.

9. The method of claim 8, wherein clock cycle rollovers indicates that the predicted event clock is expected to have one or more predetermined edges level during a next cycle of the system clock.

10. The method of claim 6, wherein re-aligning the predicted event clock emulated in the system clock domain with the system clock further comprises generating a realign signal when the number of predetermined edges of the predicted event clock does not match the number of predetermined edges of the event clock.

11. The method of claim 1, further comprising using the predicted phase difference to adjust a timestamp for one or more data packets transmitted between the event clock domain and the system clock domain or between the system clock domain and the event clock domain.

12. A method for predicting a phase difference between two clock signals, the method comprising:
   counting a number of system clock cycles occurring in a system clock domain during a predetermined number of event clock cycles counted in an event clock domain;
   dividing the counted number of system clock cycles by the counted number of event clock cycles to determine a number of system clock cycles per each event clock cycle;
   multiplying the number of system clock cycles per each event clock cycle by a known duration of the system clock cycle to predict a duration of an event clock cycle;
   emulating a predicted event clock in the system clock domain based upon the predicted duration of the event clock cycle;
   predicting a phase difference between the event clock and the system clock based upon the predicted event clock emulated in the system clock domain, wherein the predicted phase difference is predicted at an edge of the system clock and is equal to a time between the edge of the system clock and a previous edge of the predicted event clock;
   determining an expected number of event clock predetermined edges based upon the predicted phase difference;
   sampling a predetermined edge counter driven by the event clock in the event clock domain at a system clock edge to determine a sampled value of the predetermined edge counter;
   detecting the number of predetermined edges of the event clock during the last system clock cycle by comparing the value of the sampled predetermined edge counter with the last value of the sampled predetermined edge counter;
   comparing, at the system clock edge, the expected number of event clock predetermined edges to the number of predetermined edges of the event clock; and
   re-aligning the predicted event clock with the system clock if the number of event clock predetermined edges does not match the number of predetermined edges of the event clock.

13. A phase predictor comprising:
   an event clock cycle predictor for receiving a system clock running in a system clock domain and an event clock running in an event clock domain, the event clock cycle predictor for determining an event clock cycle prediction of the event clock relative to the system clock cycle;
   a phase difference predictor for emulating a predicted event clock in the system clock domain based upon the event clock cycle prediction, for predicting a phase difference between the event clock and the system clock based and for aligning the predicted event clock with the system clock based upon the predicted phase difference, wherein the predicted phase difference is predicted at an edge of the system clock and is equal to a time between the edge of the system clock and a previous edge of the predicted event clock.

14. The phase predictor of claim 13, wherein the event clock cycle predictor further comprises an event clock counter, a system clock counter and a divider circuitry for determining a number of event clock cycles that occur during each system clock cycle and wherein the phase difference determined by the phase difference predictor has a time unit equal to one system clock cycle.

15. The phase predictor of claim 13, wherein the event clock cycle predictor further comprises an event clock counter, a system clock counter and a divider circuitry for determining a number of system clock cycles that occur during each event clock cycle and wherein the phase difference determined by the phase difference predictor has a time unit equal to one event clock cycle.

16. The phase predictor of claim 13, wherein the event clock cycle predictor further comprises an event clock counter, a system clock counter and a divider circuitry for determining a duration of an event clock cycle given the duration of a system clock cycle and wherein the phase difference determined by the phase difference predictor is measured in units of time.

17. The phase predictor of claim 13, wherein the phase difference predictor further comprises:
   a phase prediction counter for determining an expected number of rising clocks of the predicted event clock in the next system clock cycle based upon the predicted phase difference.

18. The phase predictor of claim 17, wherein determining an expected number of rising clocks of the predicted event clock in the next system clock cycle based upon the predicted phase difference further comprises identifying clock cycle rollovers of the predicted event clock from the predicted phase difference.

19. The phase predictor of claim 17, wherein the phase difference predictor further comprises an alignment detector for:
   receiving the expected number of predetermined edges of the predicted event clock;
   sampling a predetermined edge counter counting the number of predetermined edges of the event clock in the event clock domain at a system clock edge to determine the number of predetermined edges of the event clock during the last system clock cycle;
   comparing the expected number of event clock predetermined edges to the actual number of predetermined edges of the event clock; and
   generating a realign signal if the number of predetermined edges of the predicted event clock does not match the number of predetermined edges of the event clock.

20. The phase predictor of claim 17, wherein the phase prediction counter is further for setting the predicted phase difference to zero if the number of predetermined edges of the predicted event clock does not match the number of predetermined edges of the event clock.

* * * * *